(12) United States Patent
Harpe

(10) Patent No.: US 9,397,679 B1
(45) Date of Patent: Jul. 19, 2016

(54) CIRCUIT AND METHOD FOR DAC MISMATCH ERROR DETECTION AND CORRECTION IN AN ADC

(71) Applicant: Stichting IMEC Nederland, Eindhoven (NL)

(72) Inventor: Pieter Harpe, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/048,597

(22) Filed: Feb. 19, 2016

(30) Foreign Application Priority Data

Feb. 19, 2015 (EP) .................................. 15155745
Apr. 2, 2015 (EP) .................................. 15162471

(51) Int. Cl.
*H03M 1/10* (2006.01)
*H03M 1/38* (2006.01)

(52) U.S. Cl.
CPC .......... *H03M 1/1014* (2013.01); *H03M 1/1071* (2013.01); *H03M 1/38* (2013.01)

(58) Field of Classification Search
CPC ... H03M 1/10; H03M 1/1014; H03M 1/1071; H03M 1/38; H03M 1/06; H03M 1/1023; H03M 1/145
USPC .................................. 341/118, 120, 163, 172
See application file for complete search history.

(56) References Cited

U.S. PATENT DOCUMENTS

| | | | | |
|---|---|---|---|---|
| 8,416,105 | B2 * | 4/2013 | Lai | H03M 1/1061 341/120 |
| 8,416,107 | B1 * | 4/2013 | Wan | H03M 1/1033 341/120 |
| 8,957,794 | B2 * | 2/2015 | Verbruggen | H03M 1/1023 341/118 |
| 9,041,569 | B2 * | 5/2015 | Zhou | H03M 1/0617 341/118 |
| 9,154,152 | B1 * | 10/2015 | Chiu | H03M 1/468 341/155 |

OTHER PUBLICATIONS

John McNeill et al., A Split-ADC Architecture for Deterministic Digital Background Calibration of a 16b 1MS/s ADC, IEEE International Sold-State Circuits Conference 2005, pp. 276, 277, and 598, Feb. 2005.
Wenbo Liu et al., A 12b 22.5/45MS/s 3.0mW 0.059mm2 CMOS SAR ADC Achieving Over 90dB SFD, IEEE International Sold-State Circuits Conference 2010, pp. 380-382, Feb. 2010.

* cited by examiner

*Primary Examiner* — Khai M Nguyen
(74) *Attorney, Agent, or Firm* — McDonnell Boehnen Hulbert & Berghoff LLP

(57) ABSTRACT

A method comprises sampling an input voltage signal, comparing the sampled input voltage signal with an output signal of a feedback DAC, and determining an (N+1) bit code representation for a comparison result, the (N+1) bit code yielding the N bit output signal. On detection of the (N+1) bit code being equal to a predefined calibration trigger code, performing a calibration for a most significant bit of the (N+1) bit code by replacing the (N+1) bit code by an alternative (N+1) bit code that yields the same N bit output signal, performing an additional comparison cycle using the alternative (N+1) bit code, determining, using comparison results of the additional comparison cycle and the preceding (N+1)$^{th}$ cycle, a sign of a DAC capacitor mismatch error, and tuning programmable binary scaled calibration capacitors in parallel to a capacitor corresponding to the one of the most significant bits of the (N+1) bit code.

5 Claims, 5 Drawing Sheets

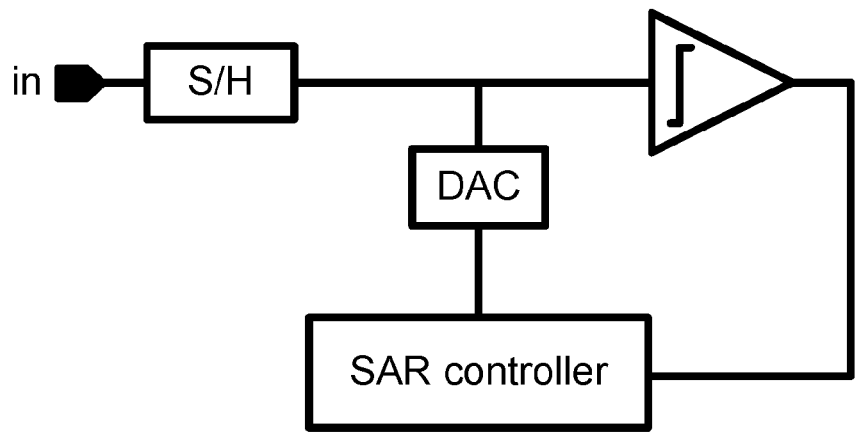
Fig. 1 – Prior Art
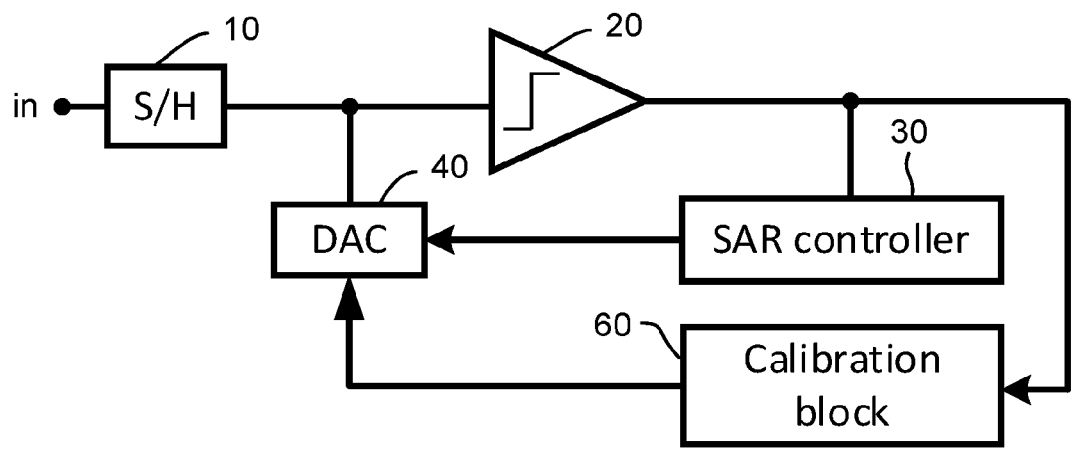
Fig. 2

|  | Code A | Code B |
|---|---|---|
| MSB: | 011111 1XXXXXXX | 100000 0XXXXXXX |
| MSB-1: | 001111 1XXXXXXX | 010000 0XXXXXXX |
| MSB-2: | 010111 1XXXXXXX | 011000 0XXXXXXX |
| MSB-3: | 011011 1XXXXXXX | 011100 0XXXXXXX |

CIRCUIT AND METHOD FOR DAC MISMATCH ERROR DETECTION AND CORRECTION IN AN ADC

CROSS-REFERENCE TO RELATED APPLICATIONS

The present application is a non-provisional patent application claiming priority to European Patent Application No. 15155745.1 filed on Feb. 19, 2015, and European Patent Application No. 15162471.5 filed on Apr. 2, 2015, the contents of each of which are hereby incorporated by reference

TECHNICAL FIELD

The present disclosure is generally related to the field of analogue-to-digital converters (ADCs), and more specifically of successive approximation register analogue-to-digital converters (SAR ADCs).

BACKGROUND

In recent years, great advances have been made in increasing the power efficiency of analogue-to-digital converters. Particularly efficient implementations are based on a successive approximation register (SAR) architecture.

In a typical successive approximation register analogue-to-digital conversion (SAR ADC) architecture the input voltage is compared against a digital-to-analogue converter (DAC) output voltage using a comparator in several cycles. The input first goes through a sample and hold block. The SAR search logic block executes a search algorithm, which typically performs a binary search. In the first cycle the input is compared against the middle of the ADC range. From the comparator output the most significant bit (MSB) can be determined. In the next cycle MSB−1 is determined. A conversion to N bits normally requires N cycles. The SAR ADC is low in cost and consumes low operating power. The excellent power efficiency of the SAR converter can be attributed both to the inherent efficiency of the binary search algorithm and the simplicity of the required hardware.

High resolution analogue-to-digital converters (ADCs) (>10 bit) with very low power and MS/s sampling rates are popular in wireless sensor nodes to obtain robust wireless communication links. However, the intrinsic accuracy (DAC matching) of a SAR ADC is limited up to 10 or 12b in modern CMOS technologies. Scaling up the device dimensions can improve matching but deteriorates power-efficiency and speed.

A conventional SAR ADC scheme is depicted in FIG. 1. A sample and hold circuit is needed, as well as a comparator, a DAC and a digital SAR controller. The analogue signal $V_{in}$ enters the sample and hold (S/H) circuit where the signal simply is sampled and held to provide a buffer for the A/D converter. $V_{in}$ is compared to a reference voltage $V_{ref}$ at the comparator input. The digital comparison result goes to the SAR controller block comprising the search logic. The controller block adjusts the digital control signals in order to narrow the compared voltages. An adjusted digital signal is outputted to a digital-to-analogue converter (DAC). This signal is converted to an adjusted $V_{ref}$, which is compared to $V_{in}$ in the comparator. A common implementation of the DAC uses an array of switchable capacitors that are controlled by the SAR controller block.

Analogue imperfections in the SAR ADC converters such as DAC mismatch and comparator offset, introduce errors that are typically mitigated through a calibration. The calibration measures and compensates for the analogue imperfections in the SAR A/D converters. However, most calibrations are implemented off-chip, as the power for the calibration circuit is relatively high when implemented on-chip. Foreground calibration is an alternative choice but it can introduce additional effort (e.g., manual effort) to perform the calibration.

Calibration methods to correct the DAC mismatches in the ADC are discussed, for example, in "*Split-ADC Architecture for Deterministic Digital Background Calibration of a 16b 1MS/s ADC*" (J. McNeill et al, ISSCC Dig. Tech. Papers, pp. 276-278, February 2005) and "*A 12b 22.5/45MS/s 3.0 mW 0.059mm2 CMOS SAR ADC Achieving Over 90 dB SFD*" (W. Liu, et al., ISSCC Dig. Tech. Papers, pp. 380-381, February 2010). However, these references propose performing a correction in the digital domain based on an adaptive learning algorithm. This means the errors in the DAC cannot be directly detected, instead they are compensated by minimizing differences in an iterative LMS algorithm. In LMS algorithms, some important coefficients need to be set to a proper value to avoid overshooting and to achieve a certain accuracy. Besides, in these examples, the algorithm can only be performed at the cost of either introducing two ADCs or doubled conversion time, which results in significant overhead in terms of area, speed, and power. Moreover, another important drawback is that the circuitry required for an adaptive learning algorithm is complex. This results in additional significant cost for the calibration circuits in terms of area and power.

Hence, there is a desire for a low-power fully automated on-chip background calibration approach for correcting DAC mismatch.

SUMMARY

The present disclosure relates to a circuit and method for DAC mismatch detection and correction in an A/D converter, whereby the overhead is kept limited.

In a first aspect, the disclosure relates to a method for calibrating an analog-to-digital converter (ADC), and converting an input voltage signal into an N bit output signal representing the input voltage signal. The method includes sampling the input voltage signal applied to the analog-to-digital converter, comparing the sampled input voltage signal with an output signal of a feedback digital-to-analogue converter (DAC), and determining, in a search logic block of the ADC, an (N+1) bit code representation for the comparison result, the (N+1) bit code yielding the N bit output signal. In this aspect, upon detection of the (N+1) bit code being equal to a predefined calibration trigger code, the method includes performing a calibration for one of the most significant bits of the (N+1) bit code by: replacing the (N+1) bit code by an alternative (N+1) bit code which yields the same N bit output signal; performing an additional comparison cycle using the alternative (N+1) bit code; determining, using the comparison results of the additional comparison cycle and of the preceding $(N+1)^{th}$ cycle, a sign of a DAC capacitor mismatch error; and tuning, in accordance with the sign of the DAC capacitor mismatch error, a set of switchable binary scaled calibration capacitors in parallel to a capacitor of the DAC, the capacitor of the DAC corresponding to the one of the most significant bits of the (N+1) bit code for which the calibration is performed.

The proposed solution indeed allows for the detection and correction of DAC mismatch errors in a simple and cost effective way. In one example, the calibration algorithm is triggered by the detection of a (N+1) bit code belonging to a predefined group of trigger codes. The redundancy available in the detected (N+1) bit code is then exploited, such as by replacing the detected (N+1) bit code by an alternative (N+1) bit code that gives rise to the same N bit output signal. An additional cycle is run, and from the difference between the two comparator results a mismatch error is discovered. Next, switchable calibration capacitors that are placed in parallel to the capacitor corresponding to the bit being calibrated are tuned so that the difference is reduced and preferably eliminated.

In an embodiment, the sign of the DAC capacitor mismatch error is stored in a calibration register.

In an embodiment the method further comprising applying a low pass filtering to a signal comprising the sign of the DAC capacitor mismatch error.

In another aspect the disclosure relates to an analogue-to-digital converter (ADC) for converting an input voltage signal into an N-bit output signal representing the input voltage signal, the analogue-to-digital converter comprising sampling means for sampling the input voltage signal, a comparator arranged for receiving the sampled input voltage signal, a digital-to-analogue converter (DAC) comprising an array of capacitors, and a search logic block arranged for receiving a comparator output signal from the comparator, for providing input to the DAC, and for producing an (N+1) bit code representation for the comparator results, the (N+1) bit code yielding the N bit output signal. In the present example, the ADC also includes a calibration block arranged for performing a calibration algorithm comprising replacement of the (N+1) bit code by an alternative (N+1) bit code that yields the same N bit output signal, performance of an additional comparison cycle using the alternative (N+1) bit code, determination of a sign of a DAC capacitor mismatch error, using the comparison results of the additional comparison cycle and of the preceding $(N+1)^{th}$ cycle and tuning, in accordance with the sign of the DAC capacitor mismatch error, a set of switchable binary scaled calibration capacitors in parallel to a capacitor of the DAC, the capacitor corresponding to the one bit of the most significant bits of the (N+1) bit code for which the calibration is performed. The ADC may also include detection means for detecting whether the (N+1) bit code is equal to a predefined calibration trigger code and for activating the calibration block.

In an embodiment, the search logic block is implemented as a successive approximation register.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF DRAWINGS

The disclosure will now be described further, by way of example, with reference to the accompanying drawings, wherein like reference numerals refer to like elements in the various figures.

FIG. 1 illustrates a conventional successive approximation register (SAR) ADC scheme.

FIG. 2 illustrates a high level scheme of an N bit ADC according to this disclosure.

DETAILED DESCRIPTION

Figure 3:
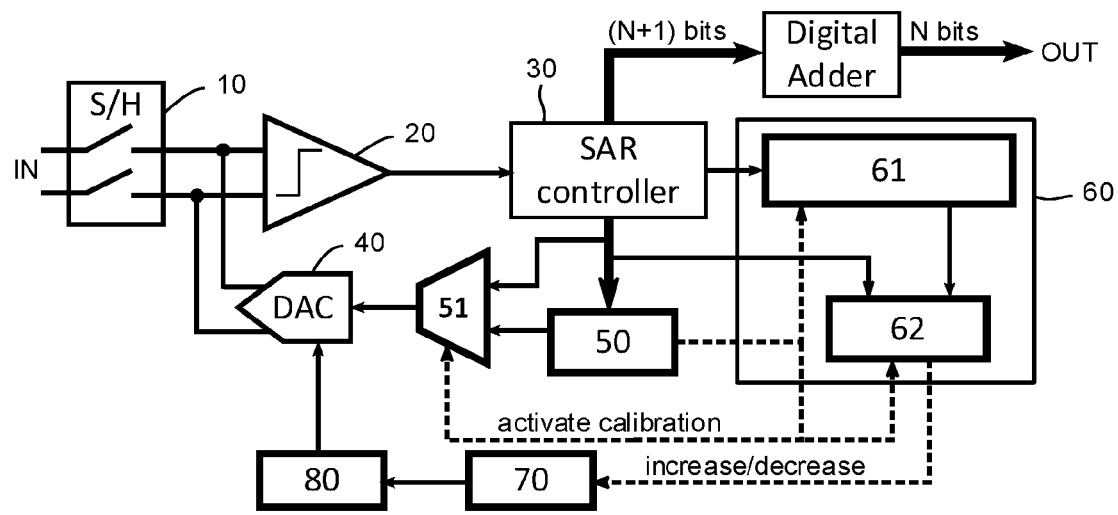
FIG. 3 illustrates a more detailed scheme of an N bit ADC according to an embodiment of this disclosure.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The present disclosure presents a low-power fully automated on-chip background calibration for DAC mismatch that utilizes a redundancy facilitated error-detection and correction scheme.

FIG. 2 illustrates the architecture of an N bit ADC adapted for performing a calibration algorithm to correct DAC mismatch according to this disclosure. FIG. 2 shows the sample and hold (S/H) switches 10, a comparator 20, an SAR search logic block 30 (N+1 cycles), and a feedback DAC 40. A total of N+1 cycles is used to perform an N bit conversion (e.g. N=13), whereby in this example there is one redundant cycle generating one redundant bit. The N bit output can be calculated from the (N+1) bit code by on-chip digital adders. The redundancy relaxes the DAC settling requirements and enables the proposed background calibration. Usually, small unit capacitors in the DAC may be used for low power and fast DAC settling when the KT/C noise requirement is met. However, due to the small unit capacitors, the DAC matching can be deteriorated. The automated background calibration according to the disclosure is capable of suppressing the DAC mismatch errors with negligible overhead in area and power. The calibration block 60 implementing the automated background calibration is also shown in the embodiment of FIG. 2.

A more detailed block diagram of the SAR ADC with the proposed calibration block 60 is shown in FIG. 3. In one example, the calibration block is only enabled for a limited set of SAR codes (e.g., (N+1) bit codes at the output of the SAR ADC) that are suitable for DAC error detection. The SAR code detection is performed by a detection block 50 that in turn enables, via calibration logic 61, a calibration algorithm 62 to perform in an additional comparison cycle a background calibration only for these specific codes. Based on the last two comparison results, the sign of the DAC mismatch error can be determined and stored in the calibration registers 80 for the calibrated MSBs of the DAC. Each register is preceded by a low pass filter (LPF) 70 to stabilize the calibration loop and to filter noise.

Figure 4:
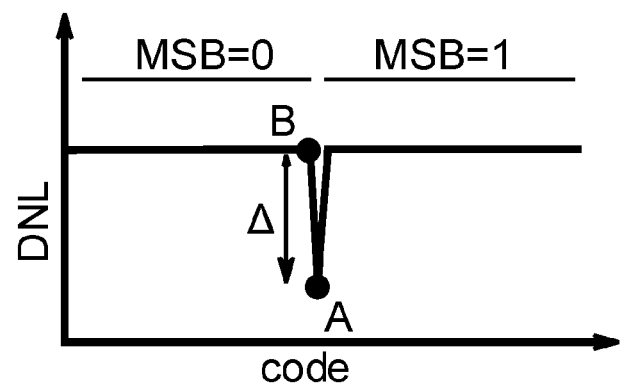
FIG. 4 illustrates a DNL error.

The principle for calibrating the DAC mismatch is based on the detection of DNL errors that indicate capacitor mismatch. A DNL (Differential Non-Linearity) error describes the deviation between two analog values corresponding to adjacent input digital values. FIG. 4 shows an example of the DNL characteristic at the most significant bit (MSB) for an N bit SAR ADC when there is mismatch at the MSB capacitor. A similar picture can be drawn for the other MSBs of the DAC.

FIG. 4 shows the DNL with an exaggerated DNL error $\Delta$ due to MSB mismatch. Thanks to the redundancy, there is a convenient way to detect the sign of $\Delta$, which is sufficient for the algorithm to tune $\Delta$ towards zero. The redundancy (i.e. N+1 raw bits for a final N bit code) implies there are multiple N+1 bit codes describing the same final N bit output. For instance, codes A and B (FIG. 5) resolve the same N bit output code and are thus equivalent. However, the bits inside codes A and B are different and, hence, the activated DAC capacitors to generate these two codes are also different. If there is no DAC capacitor mismatch, the sum of the activated DAC capacitors in code A and B is equal (in other words, their respective total capacitances is equal). On the other hand, if there is capacitor mismatch, the sum of the activated capacitors is not identical for codes A and B. This can be used as follows to perform a calibration: if code A is observed during a normal (N+1)-cycle SAR conversion, an additional (i.e. $(N+2)^{th}$) (search) cycle is added and an additional comparison of the (same) input voltage and the voltage at the feedback DAC (40) is performed. Before the $(N+2)^{th}$ cycle takes place, code A is updated to code B, thus different DAC capacitors are activated creating the same voltage at the DAC output in absence of capacitor mismatch. In this way, comparison of the comparator results for the $(N+2)^{th}$ cycle and the $(N+1)^{th}$ cycle will determine whether the analog value of code A (i.e. voltage $V_A$ at the output of the DAC) is larger or smaller than that of code B (i.e. voltage $V_B$ at the output of the DAC). With that information the MSB capacitors can be tuned to minimize DNL error $\Delta$.

Figures 7, 8:
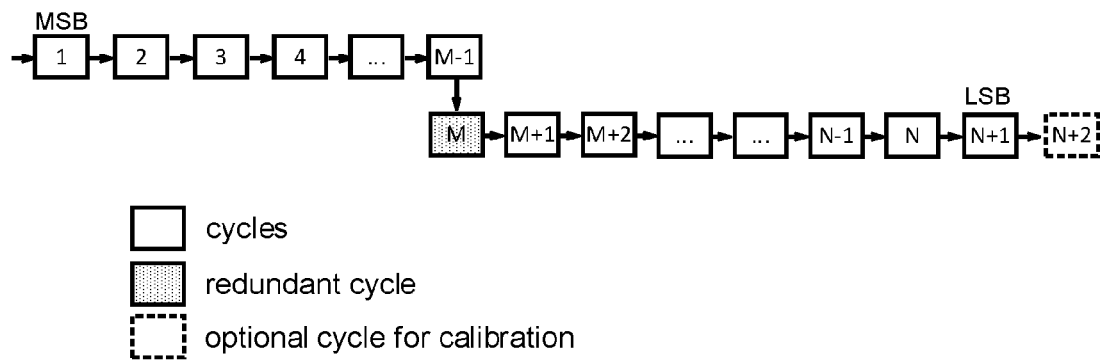
FIG. 7 illustrates the redundant bit that enables the proposed calibration.
FIG. 8 illustrates an example set of 14b codes for the detection of capacitor mismatch for different MSB bits.

Similarly to the example given for the MSB, other detection codes can be used for the other bit transitions (FIG. 8). The detection codes are selected close to the middle of the code range (e.g., around 2 k÷4 k for a 0÷8 k code for a 13 bit ADC as shown in FIG. 8) so that any sufficiently active analog signal at the ADC input obtains proper calibration. The calibration algorithm is only activated for a limited set of SAR codes from the SAR controller 30, thus the detection occurrence rate for the MSB bits calibration can be reduced to a negligible part (e.g. below 1%) of all AD conversions. The occurrence rate of the code detection can be increased or decreased by increasing or decreasing the size of the set of SAR codes used for code detection. Moreover, the correction occurrence rate can be increased or decreased by increasing or decreasing the LPF order in the loop (FIG. 3). As a result, the convergence time of the calibration can also be increased or decreased.

Figure 6:
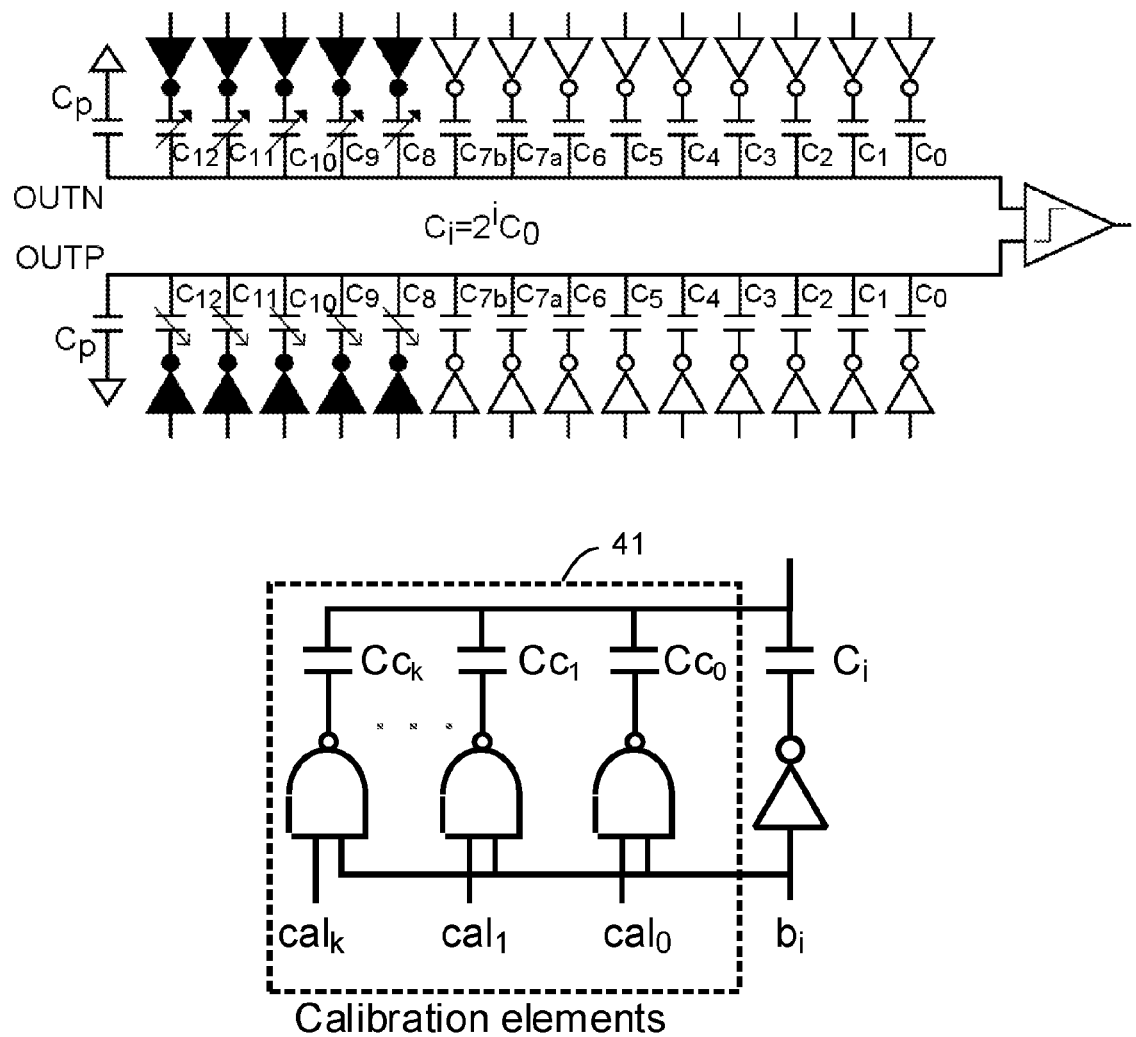
FIG. 6 illustrates an implementation of the DAC structure in an embodiment of the disclosure.

FIG. 6 shows an example implementation of the DAC structure comprising of a set of binary scaled array of capacitors ($C_0, C_1, C_2, \ldots, C_{12}$). The capacitors ($C_{12}, C_{11}, \ldots, C_8$) are considered as the MSB capacitors. Each MSB capacitor $C_i$ is connected in parallel to a calibration capacitor 41. The calibration capacitor is a set of binary-scaled capacitors ($Cc_0$, $Cc_1$, $Cc_k$) that can be programmed through a calibration control word ($cal_k, \ldots, cal_1, cal_0$). The calibration capacitor 41 can be sized in such a way that the first MSBs of the ADC can be calibrated with a step which is much smaller than 1 LSB.

The location of the redundant bit M in FIG. 7 can be chosen for example according to the following analysis: since the worst-case mismatch of the capacitors for the MSBs is larger than that of the lower bits of the DAC, only the DAC capacitors of the higher bits (e.g. $MSB_1, MSB_2, \ldots, MSB_{M-1}$) need to be calibrated. The remaining DAC capacitors corresponding to the remaining bits (e.g. $MSB_M$, $MSB_{M+1}$, $MSB_{M+2}, \ldots, LSB_{N-1}, LSB_N, LSB_{N+1}$) need not to be calibrated as their mismatch is negligible. The redundant bit can be chosen to correspond to the bit following the $MSB_{M-1}$, i.e. $MSB_M$. For the bits less significant than the redundant bit the capacitor mismatch induced error can be expected to be negligible. This can give an indication about the location of the redundant bit M. Note, however, that the location of the redundant bit can be chosen to correspond to any of the remaining bits (e.g. $MSB_M, MSB_{M+1}, MSB_{M+2}, \ldots, LSB_{N-1}, LSB_N, LSB_{N+1}$).

Figure 5:
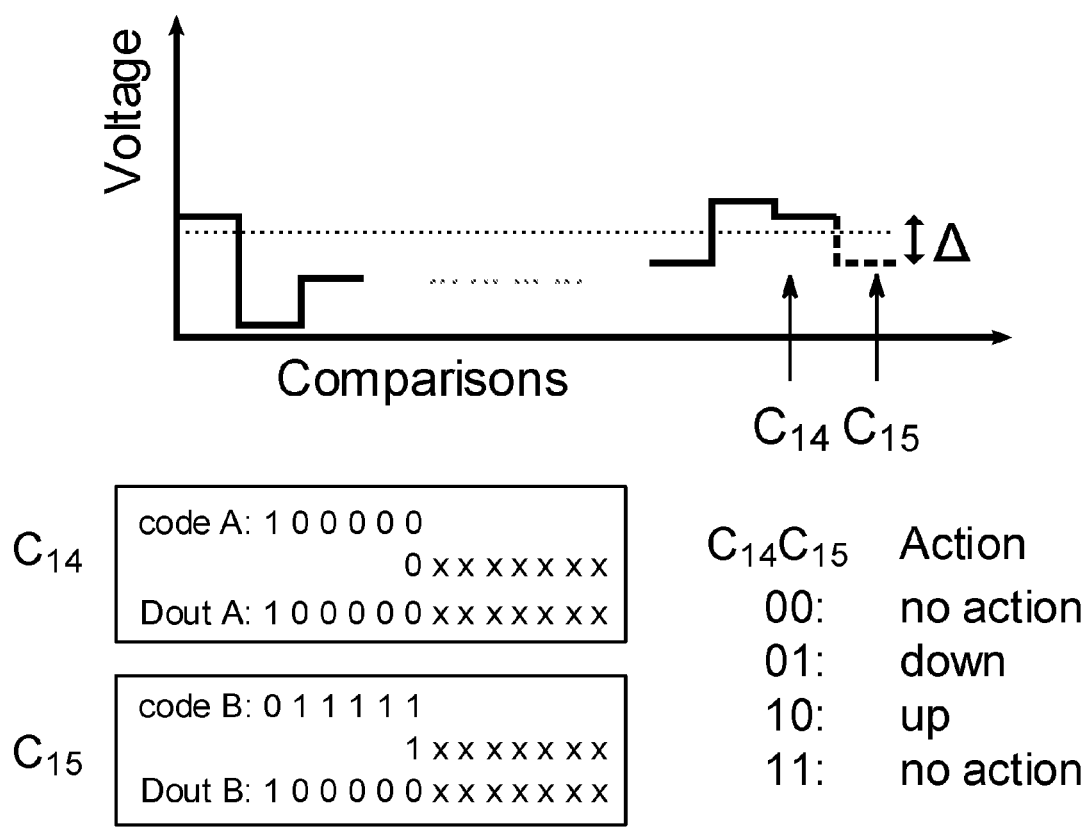
FIG. 5 illustrates two (N+1) bit codes A and B that give rise to the same N bit output code and the analog correction. In the shown example N equals 13.

The calibration method will be explained with reference to FIG. 3 which shows the signal flow when calibration occurs. The detection block 50 also generates a calibration enable signal indicating whether the calibration should take place or not. For each conversion, at the $(N+1)^{th}$ cycle, the detection block 50 senses whether the internal $(N+1)^{th}$ bit DAC code is one of the specific predetermined codes for calibration (e.g., 1000000XXXXXXX as shown in FIG. 5, with the last 0 denoting the redundant bit). If so, the calibration enable signal becomes active. As a result, the detection block 50 forces the internal (N+1) bit DAC code to its alternative code (e.g., 0111111XXXXXXX as in FIG. 5, with the last 1 denoting the redundant bit). The rest of the bits of the SAR code are denoted with X as their value is not considered by the detection block 50. Moreover, the calibration enable signal enables the additional, $(N+2)^{th}$ cycle via the calibration logic 61, so that another comparison can be performed. After comparison with the result of the $(N+1)^{th}$ cycle, the calibration logic 61 produces an output $C_{N+2}$, which is feedforwarded to the calibration algorithm 62 together with the comparison result of the $(N+1)^{th}$ cycle $C_{N+1}$ from the SAR logic. The calibration algorithm 62 generates an error sign signal, which indicates the direction for the analog correction circuit (e.g., increase or decrease). The error sign signal is sent to the LPF 70 to filter out the noise. The LPF 70 outputs a delayed error-sign signal to the calibration registers 80. The calibration registers 80 can be implemented as an accumulator to accumulate the single-bit error sign signal into a binary scaled digit. The output of the calibration registers 80 is then used for the analog corrections circuit by controlling the calibration capacitor 41 for the respective MSB. The binary scaled digit, thus controls which of the calibration capacitors ($C_k, \ldots, C_1, C_0$) are to be switched on or off.

The proposed solution offers many potential advantages. First of all, the capacitor mismatches in the DAC can be directly measured. Besides, the DAC mismatch error detection does not introduce extra complexity in the architecture because it is redundancy facilitated (see the use of a redundancy bit for the error detection). For high resolution ADCs, redundancy is usually implemented already for other reasons (e.g., DAC settling). Thus, it is almost available for free. The capacitor mismatches in the DAC can be directly corrected in the analog domain based on the detected error sign. Thus, no learning algorithm, such as an LMS algorithm, is required to find the errors, thus saving time, power, and area. The calibration circuit is simple (it includes only simple logic for code detection, D-Flip-Flops in the LPF, and a bank of switchable binary-weighted capacitors), for instance. No additional off-chip components (e.g., microprocessors, ROM) are needed. The feedforward error detection and correction scheme avoid complex digital operations and circuitry (e.g., multiplication, coefficient learning, LUT). Thus, it enables a potential good power efficiency and small area when implemented on silicon.

Only one additional cycle is needed to perform the calibration, thus the cost in speed or power is low. The correction is performed by directly compensating the capacitor value of the corresponding bit. The power consumption due to the small calibration capacitors (<1 LSB) is negligible. This gives a benefit against digital corrections, which usually include complex and power and area hungry operations. The convergence time of the calibration can be adapted by adjusting the code sets (e.g., the number of the MSBs to be calibrated) for detection and the delay in the LPF (or the convergence rate by increasing or decreasing the order of the LPF) as described above. Thus, it features a possibility of a low-power background calibration with low activation rate and/or with relatively fast convergence time. The algorithm is very simple and it can be easily extended to other resolutions without heavy work overhead.

It is to be noted that the proposed calibration can be applied in the foreground prior to normal operation. The input voltage is in that case a voltage from a predetermined set of voltages resulting in the generation of a code of the set of SAR codes.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A method for calibrating an analog-to-digital converter (ADC) converting an input voltage signal into a N bit output signal representing the input voltage signal, the method comprising:
    sampling the input voltage signal applied to the ADC;
    comparing the sampled input voltage signal with an output signal of a feedback digital-to-analogue converter (DAC);
    determining, in a search logic block of the ADC, a (N+1) bit code representation for a result of the comparison, the (N+1) bit code yielding the N bit output signal; and
    responsive to detection of the (N+1) bit code being equal to a predefined calibration trigger code, performing a calibration for one of the most significant bits of the (N+1) bit code by:
        replacing the (N+1) bit code by an alternative (N+1) bit code that yields the same N bit output signal;
        performing an additional comparison cycle using the alternative (N+1) bit code;
        determining, using the comparison results of the additional comparison cycle and of the preceding $(N+1)^{th}$ cycle, a sign of a DAC capacitor mismatch error;
        tuning, in accordance with the sign of the DAC capacitor mismatch error, a set of switchable binary scaled calibration capacitors in parallel to a capacitor of the DAC, the capacitor corresponding to the one bit of the most significant bits of the (N+1) bit code for which the calibration is performed.

2. The method for calibrating as in claim 1, wherein the sign of the DAC capacitor mismatch error is stored in a calibration register.

3. The method for calibrating as in claim 1, further comprising applying a low pass filtering to a signal comprising the sign of the DAC capacitor mismatch error.

4. An analogue-to-digital converter for converting an input voltage signal into an N-bit output signal representing the input voltage signal, the analogue-to-digital converter comprising:
   sampling means for sampling the input voltage signal;
   comparator arranged for receiving the sampled input voltage signal;
   a digital-to-analogue converter (DAC) comprising an array of capacitors;
   a search logic block arranged for receiving a comparator output signal from the comparator, for providing an input to the DAC, and for producing an (N+1) bit code representation for the comparator results, the (N+1) bit code yielding the N bit output signal;
   a calibration block arranged for performing a calibration algorithm comprising:
      replacing the (N+1) bit code by an alternative (N+1) bit code that yields the same N bit output signal;
      performing an additional comparison cycle using the alternative (N+1) bit code;
      determining a sign of a DAC capacitor mismatch error; and
      using comparison results of the additional comparison cycle and a preceding $(N+1)^{th}$ cycle and tuning, in accordance with the sign of the DAC capacitor mismatch error, a set of switchable binary scaled calibration capacitors in parallel to a capacitor of the DAC, the capacitor corresponding to the one bit of the most significant bits of the (N+1) bit code for which the calibration is performed; and
   detection means for detecting whether the (N+1) bit code is equal to a predefined calibration trigger code, and for activating the calibration block.

5. The analogue-to-digital converter as in claim 4, wherein search logic block is implemented as a successive approximation register.

* * * * *